(12) United States Patent
Sugahara

(10) Patent No.: US 7,475,970 B2
(45) Date of Patent: Jan. 13, 2009

(54) PIEZOELECTRIC ACTUATOR HAVING PIEZOELECTRIC LAYER AND VIBRATION PLATE WITH GROOVE AND LIQUID TRANSPORTING APPARATUS

(75) Inventor: Hiroto Sugahara, Aichiken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 11/940,110

(22) Filed: Nov. 14, 2007

(65) Prior Publication Data

US 2008/0084458 A1    Apr. 10, 2008

Related U.S. Application Data

(62) Division of application No. 11/213,826, filed on Aug. 30, 2005.

(30) Foreign Application Priority Data

Aug. 31, 2004   (JP)   ............... 2004-251438

(51) Int. Cl.
  *B41J 2/045*   (2006.01)
  *H01L 41/00*   (2006.01)
(52) U.S. Cl. ............... 347/70; 347/68; 310/311
(58) Field of Classification Search ................ 347/68, 347/70, 71, 72, 69; 310/311
  See application file for complete search history.

(56) References Cited

U.S. PATENT DOCUMENTS

| 7,317,276 B2 * | 1/2008 | Sugahara ............... 310/365 |
| 7,387,372 B2 * | 6/2008 | Ishikawa et al. ........ 347/68 |
| 2003/0107622 A1 | 6/2003 | Sugahara |
| 2005/0069430 A1 | 3/2005 | Sugahara |

FOREIGN PATENT DOCUMENTS

| JP | 58098259 A | * | 6/1983 |
| JP | 2187352 | | 7/1990 |
| JP | 6115070 | | 4/1994 |
| JP | 2005-105892 | | 9/2003 |
| JP | 2004-079695 | | 3/2004 |
| JP | 2004-166463 | | 6/2004 |

* cited by examiner

*Primary Examiner*—Stephen D Meier
*Assistant Examiner*—Rene Garcia, Jr.
(74) *Attorney, Agent, or Firm*—Banner & Witcoff, Ltd

(57) ABSTRACT

A piezoelectric actuator is described as including a vibration plate in which grooves associated with respective pressure chambers are formed on a surface of the vibration plate, and a piezoelectric layer on the surface of the vibration plate on an opposite side of a channel unit. Since grooves corresponding to the grooves in the vibration plate are formed also in the piezoelectric layer, it is possible to reduce a cross talk between operating sections of the piezoelectric layer. Further, chips and cracks are hardly developed in the piezoelectric layer.

9 Claims, 18 Drawing Sheets

→ SCANNING DIRECTION
↙ PAPER FEEDING DIRECTION

US 7,475,970 B2

PIEZOELECTRIC ACTUATOR HAVING PIEZOELECTRIC LAYER AND VIBRATION PLATE WITH GROOVE AND LIQUID TRANSPORTING APPARATUS

CROSS-REFERENCE TO RELATED APPLICATIONS

This application is a Divisional application of co-pending U.S. application Ser. No. 11/213,826, filed Aug. 30, 2005, which is a Nonprovisional application claiming priority under 35 U.S.C. § 119(a) on Patent Application No. 2004-251438, filed in Japan on Aug. 31, 2004, the entire contents of these applications are hereby incorporated by reference.

FIELD OF THE INVENTION

The present invention relates to a piezoelectric actuator, a liquid transporting apparatus, and a method of manufacturing liquid transporting apparatus, and in particular to a piezoelectric actuator, a liquid transporting apparatus, and a method of manufacturing liquid transporting apparatus in which a cross talk between a plurality of operating sections is reduced.

DESCRIPTION OF THE RELATED ART

An ink-jet head which discharges ink from a nozzle onto a recording paper is an example of a liquid transporting apparatus which discharges liquid onto an object subjected to discharge. This ink-jet head includes a channel unit which has an ink-discharge channel including a pressure chamber which communicates with the nozzle, and a piezoelectric actuator which causes an ink to be discharged from the nozzle by changing a volume of the pressure chamber. In this case, a general piezoelectric actuator includes a vibration plate which is positioned oppose to the pressure chamber, a piezoelectric element which is formed of a material such as lead zirconate titanate (PZT) and arranged on a surface of the vibration plate, and an individual electrode which is formed in an area facing the pressure chamber on a surface of the piezoelectric element. The piezoelectric actuator is structured such that when a drive voltage is applied to the individual electrode, an electric field is generated in the piezoelectric element positioned corresponding to the individual electrode, the piezoelectric element and the vibration plate are deformed partially so as to apply pressure on ink in the pressure chamber.

In such ink-jet head, for realizing both of high quality of recording image and the reduction of the size of the head, there is a tendency that a plurality of nozzles are arranged closely. However, when an attempt is made to arrange a large number of nozzles very closely, it is necessary to arrange a plurality of pressure chambers closely, too. Therefore, when a voltage is applied to an individual electrode facing a certain pressure chamber and the piezoelectric element to deform the vibration plate, this deformation is propagated even to a piezoelectric element and a vibration plate of an area corresponding to an adjacent pressure chamber, which in turn causes a phenomenon (a so-called cross talk) which destabilizes the ink-discharge characteristics of a nozzle communicating with the adjacent pressure chamber. As a result the negative effect exerted on a printing quality cannot be neglected. More specifically, due to the cross talk, there is an increased variation in a speed of the ink droplet discharged from each of the nozzles or a decrease of discharge stability.

In view of the situation, an ink-jet head is disclosed in Japanese Patent Application Laid-open No. 2-187352 and Japanese Patent No. 3152260. In this ink-jet head, a groove is formed by a dicing process in an area of the piezoelectric element and the vibration plate, which does not overlap with the pressure chamber, with the piezoelectric element joined to a surface of the vibration plate, so that the deformation of the piezoelectric element and the vibration plate is hardly propagated between the adjacent pressure chambers.

Japanese Patent Application Laid-open No. 2-187352 discloses laminating a piezoelectric element on the vibration plate before forming a groove in the vibration plate and cutting the piezoelectric element and the vibration plate simultaneously so that the groove is formed in the vibration plate. The obtained head has a structure in which the piezoelectric element is divided into individual piezoelectric elements with a plurality of the grooves intervening therebetween in the vibration plate, as shown in FIGS. 1 and 2 of this patent document.

Japanese Patent No. 3152260 discloses, to prevent the cross talk, laminating the vibration plate and the piezoelectric element on the pressure chamber and then cutting simultaneously the piezoelectric element and the vibration plate so that a groove is formed which extends to a side wall of the pressure chamber. The obtained head has a structure in which not only the piezoelectric element but also the vibration plate are divided for each of the pressure chambers, as shown in FIGS. 1 to 4 of Japanese Patent No. 3152260.

SUMMARY OF THE INVENTION

In ink-jet heads according to the patent documents described above, when a large number of pressure chambers is arranged closely, it is necessary to form a groove with a very high accuracy so that a groove is not formed even in an area of a piezoelectric layer and a vibration plate, facing a pressure chamber. However, if an attempt is made to form this groove by a mechanical process such as dicing, the manufacturing cost of the ink-jet head becomes very high. In a conventional ink-jet head, a piezoelectric element is formed by baking a green sheet of PZT. However, if the groove is formed by a mechanical process on the piezoelectric element after baking, a chip or a crack tend to occur in the piezoelectric element, due to which there is a decline in yield during the manufacturing process, and a tear is developed in the chipped or cracked piezoelectric element by repeating recording operations, thereby deteriorating the reliability of discharge.

In addition, in a structure in which a piezoelectric element is cut and isolated for each pressure chamber as disclosed in the patent documents described above, the piezoelectric element easily exfoliates from the vibration plate during driving of the piezoelectric element.

A first object of the present invention is to provide a piezoelectric actuator, a liquid transporting apparatus and a method of manufacturing liquid transporting apparatus which is capable of forming a groove for reducing a cross talk in the vibration plate and the piezoelectric layer while maintaining a high yield and a low manufacturing cost. A second object of the present invention is to provide a piezoelectric actuator, a liquid-jet apparatus, and a method of manufacturing liquid-jet apparatus which is capable of preventing the exfoliation of the piezoelectric layer while preventing the cross talk in portions of the piezoelectric layer corresponding to adjacent pressure chambers.

According to a first aspect of the present invention, there is provided a method of manufacturing a liquid transporting apparatus including a channel unit in which a plurality of pressure chambers communicating with a discharge port which discharges a liquid are arranged along a flat surface;

and a piezoelectric actuator which includes a vibration plate which is joined to one surface of the channel unit to cover the pressure chambers, and a piezoelectric layer formed of a piezoelectric material, and which changes selectively a volume of the pressure chambers, the method comprising: a step of providing, on the channel unit, a vibration plate having grooves formed on a surface thereof, the grooves being associated with the respective pressure chambers; and a piezoelectric layer forming step of forming the piezoelectric layer by depositing particles of a piezoelectric material on the surface of the vibration plate on which the grooves have been formed. The grooves associated with the respective pressure chambers may be connected to form a continuous groove area.

This liquid transporting apparatus applies pressure on a liquid in the pressure chamber by changing a volume of the pressure chamber by partially deforming the vibration plate and the piezoelectric layer in the area overlapping with the pressure chamber, and discharges the liquid from a nozzle. During manufacturing of this liquid transporting apparatus, firstly, a vibration plate which has grooves, associated with the respective pressure chambers, formed on the surface of the vibration plate are prepared and the vibration plate is provided on the channel unit. Next, the piezoelectric layer is formed by depositing the particles of a piezoelectric material on the surface of the vibration plate on which the grooves have been formed. At this time, grooves similar to these grooves on the vibration plate are formed in the piezoelectric layer at positions corresponding to the grooves formed on the vibration plate. Therefore, the vibration plate and the piezoelectric layer become thin in an area between the pressure chambers where the grooves are formed in the vibration plate. Accordingly, when portions of the piezoelectric layer and the vibration plate in a position overlapping with a certain pressure chamber are deformed partially, the deformation is hardly propagated to another portions of the piezoelectric layer and the vibration plate in a position overlapping with other pressure chamber, thereby reducing the cross talk. Moreover, the grooves can be formed in the piezoelectric layer only by depositing the particles of the piezoelectric material on the surface of the vibration plate in which the grooves are formed. Accordingly, as compared to a case of forming the grooves in the piezoelectric layer by a mechanical process, the grooves can be formed at a low cost. Furthermore, a chip and a crack are hardly developed in the piezoelectric layer, thereby improving the yield and the reliability of discharge.

Upon providing the grooves in the vibration plate, grooves which extend along edges of the pressure chambers may be formed in an area on the surface of the vibration plate on an opposite side of the channel unit, the area not overlapping with the pressure chambers, or the grooves in the vibration plate may be formed in an area which overlaps with the pressure chambers (groove forming step). In the latter case, the grooves may be formed in an area where the grooves divide the pressure chambers into a central portion and a peripheral portion. The cross talk can be prevented effectively by providing the grooves in positions associated with the pressure chambers. The liquid transporting apparatus may be, for example, a liquid-jet apparatus, and in this case, the discharge port is a nozzle which discharges the liquid.

In the piezoelectric layer forming step of the method of manufacturing liquid transporting apparatus according to the present invention, the piezoelectric layer on surfaces of the grooves may be formed to be thinner than the piezoelectric layer in an area other than the surfaces of the grooves. Therefore, in addition to the vibration plate becoming partially thin due to the groove, the piezoelectric layer formed on the surface of the groove in the vibration plate also becomes thin. Accordingly, it is possible to further reduce the cross talk.

In the piezoelectric layer forming step in the method of manufacturing liquid transporting apparatus of the present invention, the piezoelectric layer may be formed by a chemical deposition method or an aerosol deposition method. When the piezoelectric layer is formed by the chemical deposition method or the aerosol deposition method, the piezoelectric layer on the surfaces of the grooves can be made easily thinner than the piezoelectric layer in an area other than the surfaces of the grooves.

In the groove forming step of the method of manufacturing liquid transporting apparatus of the present invention, the grooves may be formed to substantially surround the associated pressure chambers as viewed from the direction orthogonal to the flat surface. When the pressure chambers are respectively surrounded by the grooves, the deformation of the piezoelectric layer in the area overlapping with one of the pressure chambers is hardly propagated to an area overlapping with other pressure chamber, thereby reducing the cross talk assuredly.

In the groove forming step of the method of manufacturing liquid transporting apparatus of the present invention, one of the grooves may be common in an area between two adjacent pressure chambers. Thus, by forming the grooves commonly between the two pressure chambers, the number of grooves can be reduced. Further, since the thickness of one groove becomes greater, it is easy to form the grooves.

In the method of manufacturing liquid transporting apparatus of the present invention, the vibration plate may be formed of an electroconductive metallic material, and the method may further comprise an individual electrode forming step of forming a plurality of individual electrodes in an area of the piezoelectric layer, the area overlapping with the pressure chambers as viewed from a direction orthogonal to the flat surface, after the piezoelectric layer forming step. Thus, since the vibration plate is made of the metallic material, the grooves can be formed easily in the vibration plate by a method such as etching. Moreover, since the vibration plate is electroconductive, the vibration plate can be made to function as a common electrode which faces the individual electrodes and generates an electric field in the piezoelectric layer. Accordingly, it is possible to omit the common electrode and to simplify a structure of the piezoelectric actuator.

In the method of manufacturing liquid transporting apparatus of the present invention, the vibration plate may be formed of an electroconductive metallic material, and the method may further comprise: an insulating film forming step which is a step after the groove forming step and before the piezoelectric layer forming step, and is a step of forming an insulating film on the surface of the vibration plate on the opposite side of the channel unit; an individual electrode forming step which is a step after the insulating film forming step, and is a step of forming a plurality of individual electrodes in an area of the insulating film which overlaps with the pressure chambers as viewed from the direction orthogonal to the flat surface; and a common electrode forming step which is a step after the piezoelectric layer forming step, and is a step of forming a common electrode in an area of the piezoelectric layer which overlaps with the individual electrodes as viewed from the direction orthogonal to the flat surface. In this case, since the vibration plate is made of an electroconductive metallic material, it is possible to form the groove easily in the vibration plate by a method such as etching.

The method of manufacturing liquid transporting apparatus of the present invention may comprise a joining step which is a step after the groove forming step and before the piezoelectric layer forming step, and is a step of joining the vibration plate to the channel unit. The vibration plate after the grooves have been formed therein in the groove forming step is susceptible to breaking due to the decline in strength particularly in portions where the grooves are formed. However, because the vibration plate is joined to the channel unit before forming the piezoelectric layer in the surface of the vibration plate, the vibration plate is reinforced by the channel unit and hardly breaks. Therefore, it is easy to handle the vibration plate in the piezoelectric layer forming step.

According to a second aspect of the present invention, there is provided a piezoelectric actuator which has a plurality of operating sections, the piezoelectric actuator comprising: a vibration plate having first grooves formed therein, the first grooves being associated with respective operating sections; a piezoelectric layer which is provided on the vibration plate, and which has second grooves formed therein, the second grooves corresponding to the first grooves in the vibration plate, and in which a thickness of the piezoelectric layer in the second grooves is less than a thickness of the piezoelectric layer in an area in which no second groove are formed; and individual electrodes which are provided on the respective operating sections of the piezoelectric layer and which supply a drive voltage to the respective operating sections.

According to a third aspect of the present invention, there is provided a liquid transporting apparatus comprising: a channel unit including a plurality of pressure chambers formed therein, each of the pressure chambers having a supply port and a discharge port which discharges a liquid; a vibration plate which is provided on the channel unit to cover the pressure chambers, and which has first grooves formed therein, the first grooves being associated with the respective pressure chambers; a piezoelectric layer which is provided on the vibration plate and which has second grooves formed therein, the second grooves corresponding to the first grooves in the vibration plate, and in which a thickness of the piezoelectric layer in the second grooves is less than a thickness of the piezoelectric layer in an area in which no second grooves are formed; and individual electrodes which are provided on the piezoelectric layer to supply a drive voltage to the piezoelectric layer corresponding to the pressure chambers.

In the piezoelectric actuator and the liquid transporting apparatus of the present invention, since the firsts groove are formed in the vibration plate and the second grooves, corresponding to the first grooves in the vibration plate, are formed in the piezoelectric layer, the cross talk between the operating sections or between portions of the piezoelectric layer corresponding to the pressure chambers is effectively prevented. Moreover, in the second grooves of the piezoelectric layer, there is remained a portion of the piezoelectric layer having a thickness less than a thickness of the piezoelectric layer in an area in which no second grooves are formed. Therefore, the piezoelectric layer is hardly exfoliated from the vibration plate and a mechanical strength of the piezoelectric layer can be maintained.

In the piezoelectric actuator and the liquid transporting apparatus of the present invention, one of the grooves may be provided for each of the operating sections or each of the pressure chambers, or one of the grooves may be common for adjacent operating sections or adjacent pressure chambers. The grooves may be provided in an area which overlaps with the operating sections or the pressure chambers, or in an area which does not overlap with the operating sections or the pressure chambers. In the piezoelectric actuator or the liquid transporting apparatus of the present invention, the vibration plate may be an electrode which is common for the operating sections or the pressure chambers. In the piezoelectric actuator and the liquid transporting apparatus of the present invention, the thickness of the piezoelectric layer in the second grooves is less than a depth of the first grooves.

The piezoelectric actuator in the present invention may be used in the liquid transporting apparatus which is represented by an ink-jet apparatus such as an ink-jet head. Or the piezoelectric actuator in the present invention can be used as an optical deflector plate or an optical switch for optical communication by providing an optical element such as a mirror. Or, the piezoelectric actuator in the present invention can be used as a display unit in which each of the operating sections is a pixel.

BRIEF DESCRIPTION OF THE DRAWINGS

FIG. 6A shows a groove forming step and a joining step, FIG. 6B shows a piezoelectric layer forming step, and FIG. 6C shows an individual electrode forming step;

DETAILED DESCRIPTION OF THE PREFERRED EMBODIMENTS

First Embodiment

Embodiments of the present invention will be described below. A first embodiment is an example in which the present invention is applied to an ink-jet head which discharges ink on a recording paper as a liquid-jet apparatus.

Figure 1:
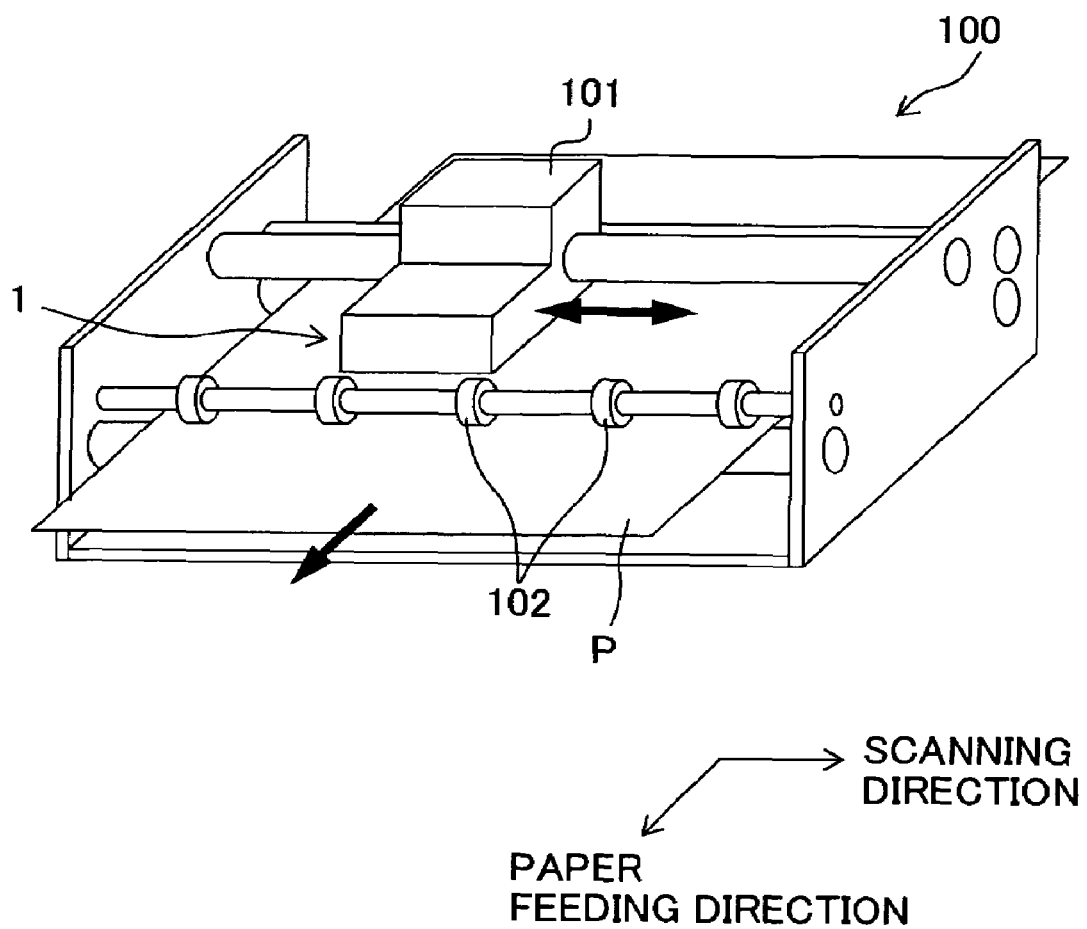
FIG. 1 is a schematic perspective view of an ink-jet printer according to an embodiment of the present invention.

Firstly, an ink-jet printer 100 which includes an ink-jet head 1 will be described briefly. As shown in FIG. 1, the ink-jet printer 100 includes a carriage 101 which is movable in a left and right direction in the drawing (direction indicated by a two-pointed arrow), the ink-jet head 1 of serial type which is provided on the carriage 101 and discharges ink onto a recording paper P, and transporting rollers 102 which carry the recording paper P in a forward direction (direction indicated by a horizontal arrow) in FIG. 1. The ink-jet head 1 moves integrally with the carriage 101 in a left and right direction (scanning direction) and discharges ink onto the recording paper P from ejecting ports of nozzles 20 (refer FIGS. 2 to 5) formed in an ink-discharge surface of a lower surface of the ink-jet head 1. The recording paper P, with an image recorded thereon by the ink-jet head 1, is discharged forward (paper sending direction) by the transporting rollers 102.

Figure 2:
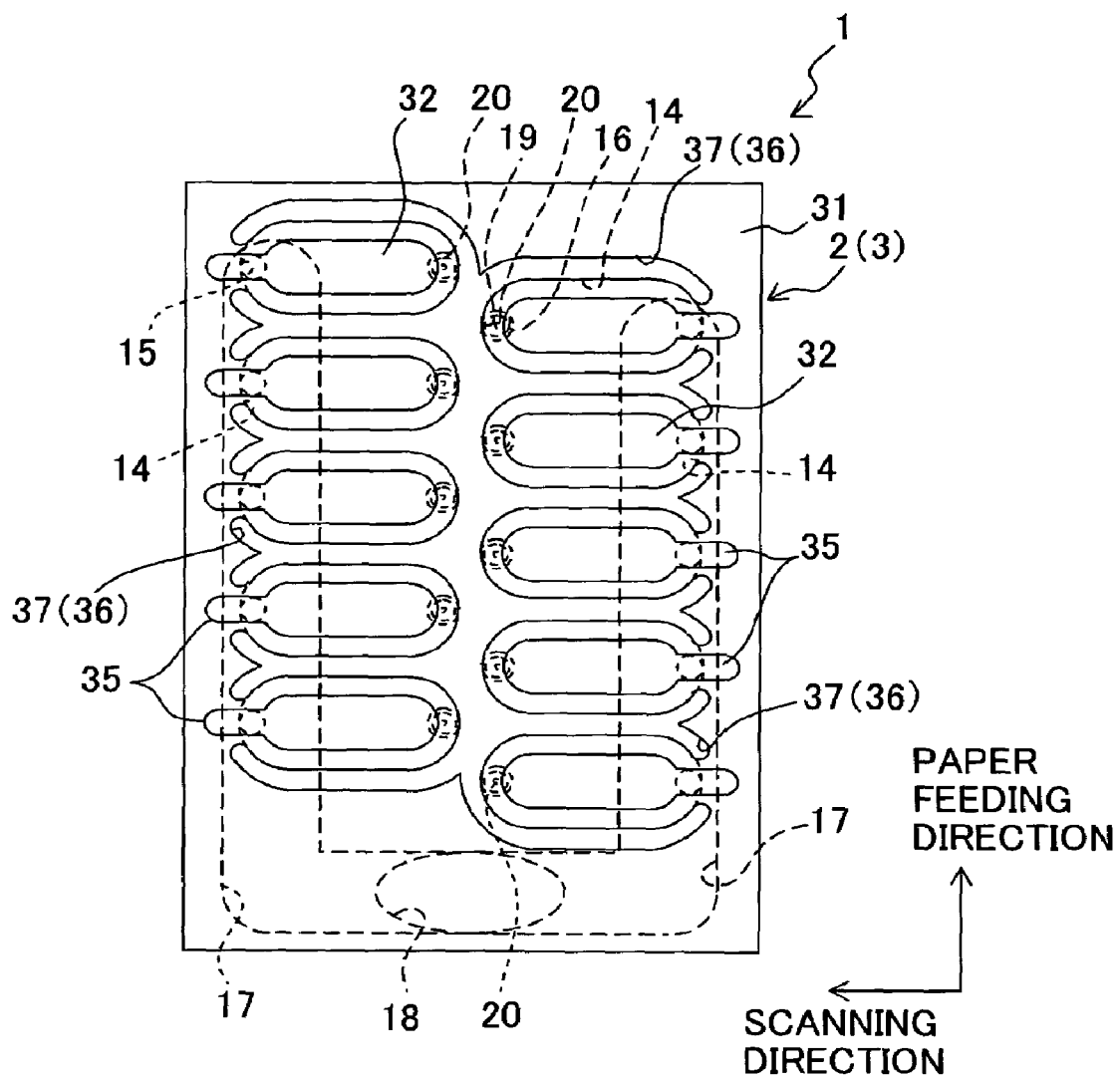
FIG. 2 is a plan view of the ink-jet head.
Figure 3:
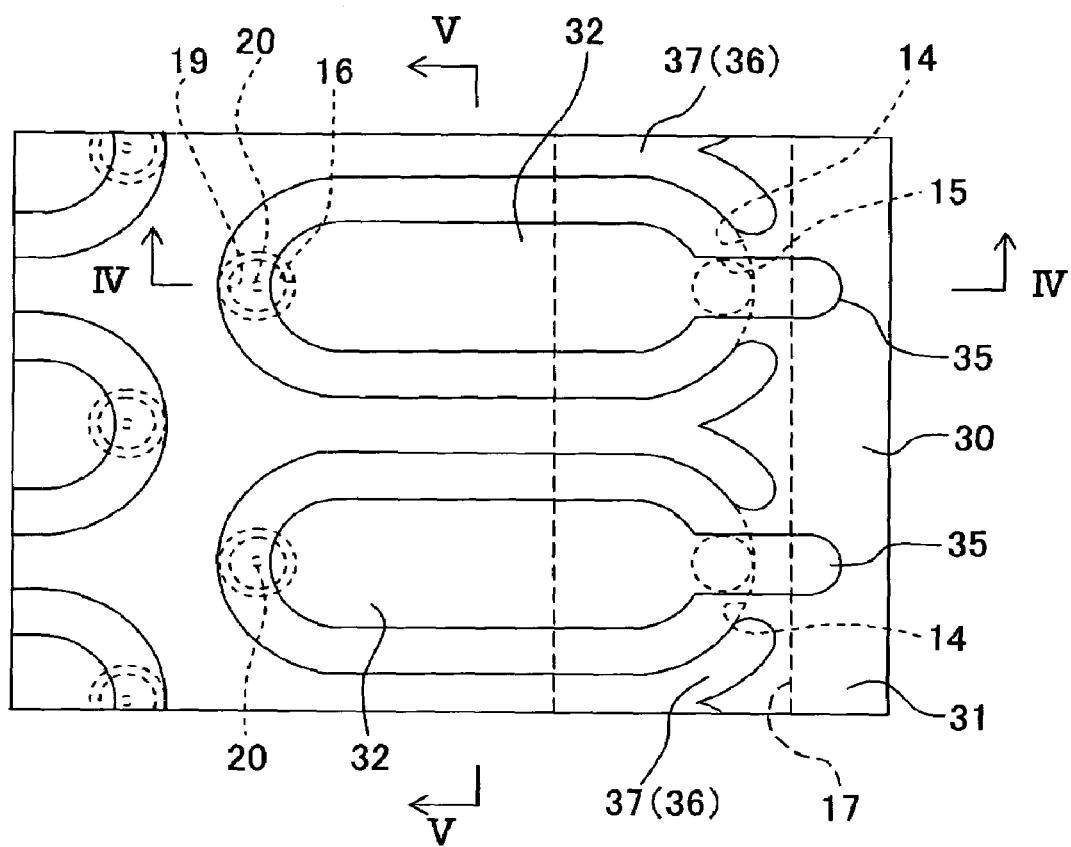
FIG. 3 is a partially enlarged plan view of FIG. 2.
Figure 4:
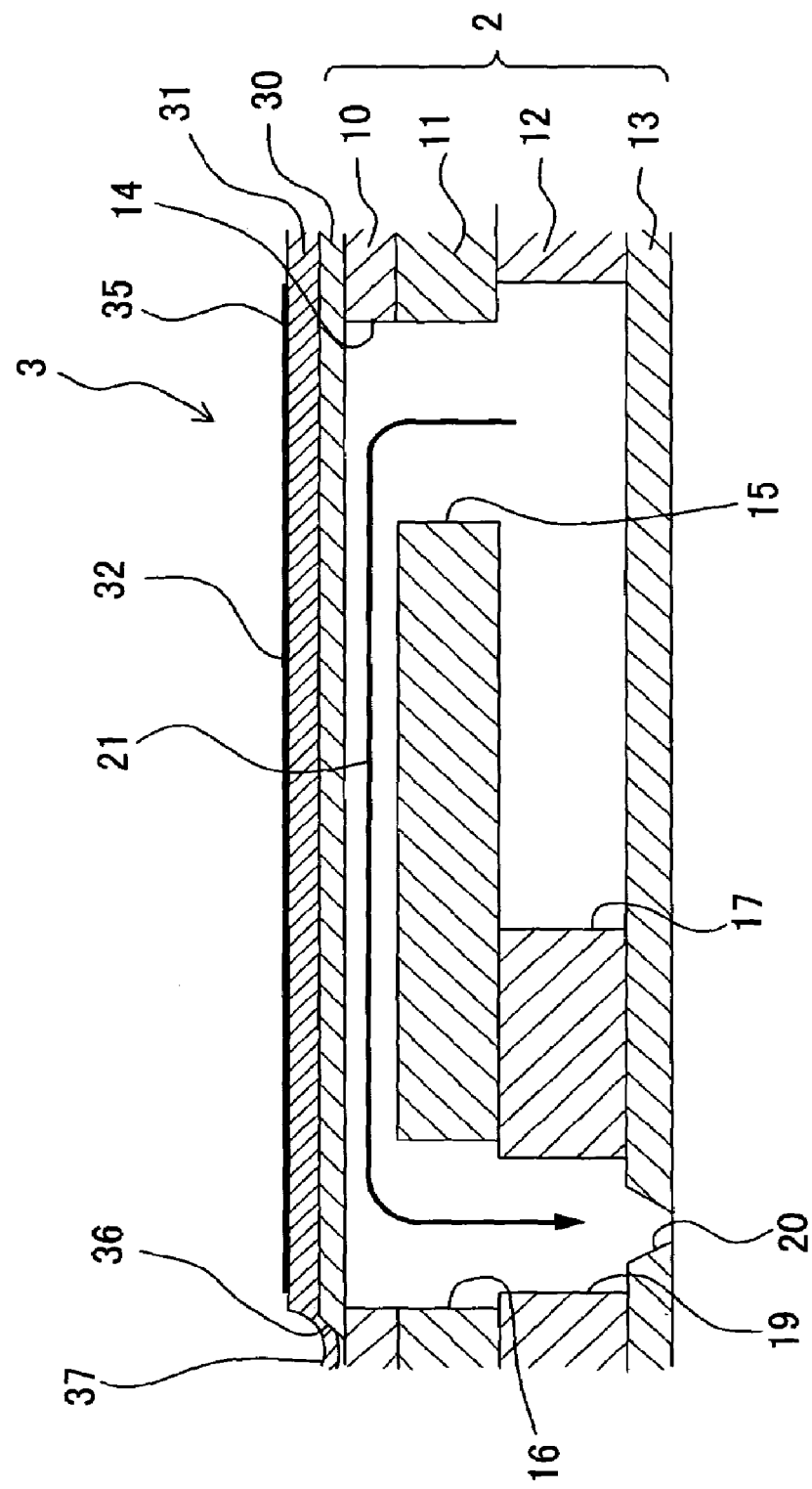
FIG. 4 is a cross-sectional view taken along a line IV-IV shown in FIG. 3.

Next, the ink-jet head 1 will be described in detail with reference to FIGS. 2 to 5. As shown in FIGS. 2 to 4, the ink-jet head 1 includes a channel unit 2 in which an individual ink passage 21 (refer to FIG. 4) which includes a pressure chamber 14 inside is formed and a piezoelectric actuator 3 which is laminated on an upper surface of the channel unit 2.

The channel unit 2 will be described below. As shown in FIG. 4, the channel unit 2 includes a cavity plate 10, a base plate 11, a manifold plate 12, and a nozzle plate 13, and these four plates 10 to 13 are joined in stacked layers. Among these four plates, the cavity plate 10, the base plate 11, and the manifold plate 12 are stainless steel plates, and an ink channel, such as the pressure chamber 14, and a manifold 17 which will be described later, can be formed easily in these plates by etching. Moreover, the nozzle plate 13 is formed of a high-molecular synthetic resin material such as polyimide and is joined to a lower surface of the manifold plate 12. Or the nozzle plate 13 may also be formed of a metallic material such as stainless steel, similar to the three plates 10 to 12.

As shown in FIGS. 2 to 4, in the cavity plate 10, a plurality of pressure chambers 14 arranged along a flat surface is formed. These pressure chambers 14 are open in a surface (an upper surface of the cavity plate 10 to which a vibration plate 30 which will be described later is joined) of the channel unit 2. Moreover, the pressure chambers 14 are arranged in two rows in the paper feeding direction (vertical direction in FIG. 2). Each pressure chamber 14 is substantially elliptical in a plan view and is arranged such that the long axis is the left and right direction (scanning direction). Moreover, an ink-supply port 18 which communicates with an ink tank (not shown in the diagram) is formed in the cavity plate 10.

As shown in FIG. 3 and FIG. 4, communicating holes 15 and 16 are formed in the base plate 11 at positions which overlap in a plan view with both end portions of the associated pressure chamber 14 in the long axis direction. In addition, in the manifold plate 12, a manifold 17, which is extended in the paper feeding direction (vertical direction in FIG. 2) and overlaps with any one of left and right end portions of the pressure chamber 14 in a plan view in FIG. 2, is formed. Ink is supplied to the manifold 17 from the ink tank via the ink-supply port 18. Moreover, a communicating hole 19 is formed at a position which overlaps in a plan view with an end portion on a side of the pressure chamber 14 opposite to the manifold 17. Furthermore, a plurality of nozzles 20 is formed in the nozzle plate 13 at positions which overlap in a plan view with a plurality of communicating holes 19. The nozzle 20 is formed for example, by means of excimer laser process on a substrate of a high-molecular synthetic resin such as polyimide.

As shown in FIG. 4, the manifold 17 communicates with the pressure chamber 14 via the communicating hole 15, and the pressure chamber 14 communicates with the nozzle 20 via the communicating holes 16 and 19. Thus, an individual ink channel 21 from the manifold 17 to the nozzle 20 via the pressure chamber 14 is formed in the channel unit 2.

Next, the piezoelectric actuator 3 will be described below. As shown in FIGS. 2 to 5, the piezoelectric actuator 3 includes the vibration plate 30, the piezoelectric layer 31, and a plurality of individual electrodes 32. The vibration plate which is electroconductive is arranged on an upper surface of the channel unit 2. The piezoelectric layer 31 is formed continuously on an upper surface of the vibration plate 30, spreading across the pressure chambers 14. The individual electrodes 32 are formed on an upper surface of the piezoelectric layer 31 corresponding to the respective pressure chambers 14.

The vibration plate 30 is a plate having roughly rectangular shape in a plan view and is made of a metallic material such an iron alloy like stainless steel, a copper alloy, a nickel alloy, or a titanium alloy. The vibration plate 30 is joined in a laminated state to the upper surface of the cavity plate 10 such that openings of the pressure chambers 14 are closed. Moreover, the vibration plate 30 positioned facing the plurality of individual electrodes 32 also serves as a common electrode which generates an electric field in the piezoelectric layer 31 between the individual electrode 32 and the vibration plate 30. A groove 36, which extends along an edge of the pressure chamber 14 and surrounds the pressure chamber 14 except for an end portion on a side of the manifold 17 of each of the pressure chambers 14, is formed in the upper surface of the vibration plate 30 (a surface opposite to a surface facing the channel unit 2) in an area which does not overlap with the pressure chambers 14 in a plan view. The groove 36 is formed in an area between the two adjacent pressure chambers 14 and in common for these two adjacent pressure chambers 14.

Figure 5:
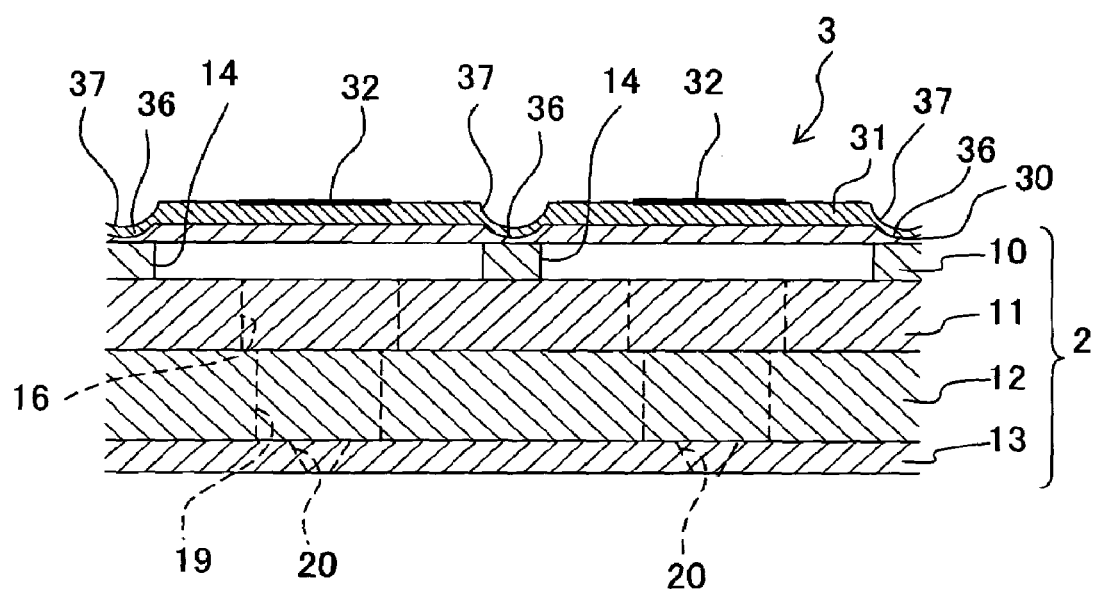
FIG. 5 is a cross-sectional view taken along a line V-V shown in FIG. 4.

The piezoelectric layer 31 which is composed of mainly lead zirconate titanate (PZT) which is a solid solution of lead titanate and lead zirconate, and is a ferroelectric substance is formed on the surface of the vibration plate 30. The piezoelectric layer 31 is formed continuously spreading across the pressure chambers 14. A groove 37 which has a planer shape similar to that of the groove 36 is formed in the piezoelectric layer 31 at a position facing the groove 36 in the vibration plate 30. As shown in FIG. 4 and FIG. 5, a thickness of the piezoelectric layer 31 in this groove 37 is less than a thickness of the piezoelectric layer 31 in an area where the groove 37 is not formed.

The plurality of individual electrodes 32 which are elliptic, flat and smaller in size than the pressure chamber 14 to a certain extent are formed on a surface of the piezoelectric layer 31. Each of the individual electrodes 32 is formed at a position overlapping with a central portion of the corresponding pressure chamber 14 in a plan view. The individual electrodes 32 are made of an electroconductive material such as gold. Furthermore, on the surface of the piezoelectric layer 31, a plurality of terminal sections 35 which are respectively connected to the individual electrodes 32 are formed at positions partially overlapping with end portions which are not surrounded by the grooves 37 of the pressure chambers 14. These terminal sections 35 are connected electrically to a driver IC (omitted in the diagram) via a flexible wiring member such as a flexible printed circuit board, and a drive voltage is selectively supplied to the individual electrodes 32 from the driver IC via the terminal sections 35.

Next, an action of the piezoelectric actuator 3 will be described. When a drive voltage is selectively applied from the driver IC to the individual electrodes 32, the electric potential of the individual electrode 32 disposed on the upper side of the piezoelectric layer 31 to which the drive voltage is supplied differs from the electric potential, which is held at a ground potential, of the vibration plate 30 which serves as the common electrode on a lower side of the piezoelectric layer, and thus an electric field is generated in a vertical direction of a part of the piezoelectric layer 31 which is sandwiched between the individual electrode 32 to which the drive voltage is applied and the vibration plate 30. As the electric field is generated, the part of the piezoelectric layer, disposed directly below the individual electrode 32 to which the drive voltage is applied, contracts in a horizontal direction which is orthogonal to a vertical direction in which the piezoelectric layer 31 is polarized. At this time, since the vibration plate 30 is deformed due to the horizontal contraction of the piezoelectric layer 31 so as to project toward the pressure chamber 14, a volume inside the pressure chamber 14 decreases and a pressure is applied on the ink in the pressure chamber, thereby discharging the ink from the nozzle 20 communicating with the pressure chamber 14. Each of the parts sandwiched between the respective individual electrodes 32 and the vibration plate 30 functions as an operating section of the piezoelectric actuator.

As shown in FIG. 2, in the ink-jet head 1 of the first embodiment, the pressure chambers 14 are arranged closely along a flat surface. When a drive voltage is applied to an individual electrode 32 corresponding to a certain pressure chamber 14, and a part of the piezoelectric layer 31 at a position overlapping with this pressure chamber 14 is deformed, a so-called phenomenon of cross talk, in which the deformation is propagated to parts of the vibration plate 30 and the piezoelectric layer 31 overlapping with an adjacent pressure chamber 14, tends to occur. However, as described above, the grooves 36 and 37, which extend along the edge of each of the pressure chambers 14 and roughly surround each of the pressure chambers 14 are formed respectively in the area of the vibration plate 30 and the piezoelectric layer 31 which do not overlap with the pressure chamber in a plan view. In the area where these grooves 36 and 37 are formed, the thicknesses of the vibration plate 30 and the piezoelectric layer 31 are respectively less than the thickness in other area in which no grooves 36 and 37 are formed. Therefore, since the deformation of the parts of the vibration plate 30 and the piezoelectric layer 31 respectively overlapping with a certain pressure chamber 14 is hardly propagated to other parts of the vibration plate 30 and the piezoelectric layer 31 respectively overlapping with other adjacent pressure chamber 14, it is possible to prevent the cross talk assuredly. Moreover, the piezoelectric layer 31 exists also at a bottom of the groove 37. In other words, the piezoelectric layer 31 is not cut and isolated for each of the operating sections but maintains a continuous form. Therefore, as compared to a case in which operating sections of the piezoelectric layer are cut and isolated from each other, the piezoelectric layer 31 is hardly exfoliated from the vibration plate 30 and the mechanical strength and the durability of the piezoelectric layer 31 is improved.

In an area where the grooves 36 and 37 of the vibration plate 30 and the piezoelectric layer 31 are respectively formed, a thickness of the piezoelectric layer 31 which is deposited in the deepest portion of the groove 37 is less than a depth of the deepest portion of the groove 37. For this reason, when the part of the piezoelectric layer 31, which is sandwiched between the individual electrode 32 and the vibration plate 30 serving as a common electrode, operates as in the first embodiment, displacement of the piezoelectric layer 31 deposited in the groove 37 due to an effect of the leakage electric field is reduced, thereby further preventing the cross talk and the decline in drive efficiency.

Figure 6A:
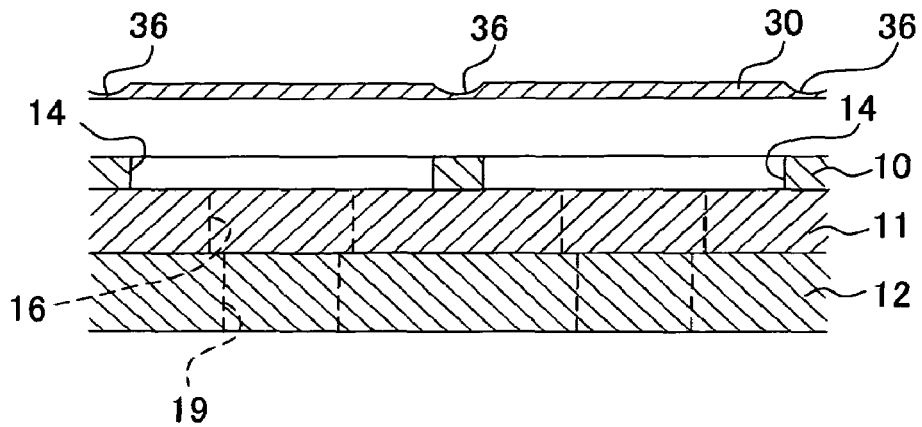
FIGS. 6A, 6B, and 6C are diagrams showing steps of manufacturing the ink-jet head, where

Next, a method of manufacturing the ink-jet head 1 will be described. As shown in FIG. 6A, among the plates 10 to 13 in the channel unit 2, except the nozzle plate 13 which is made of a synthetic resin, the three metal plates, i.e. the cavity plate 10, the base plate 11, and the manifold plate 12 are joined. On the other hand, the grooves 36 described above, which extend along the edge of the pressure chambers 14 and which roughly surround the pressure chambers 14, are formed (groove forming step) in an area on the upper surface of the vibration plate 30 (a surface opposite to the surface which is joined to the channel unit 2), the area not overlapping in a plan view with the associated pressure chambers 14. Here, since the vibration plate 30 is made of a metallic material such as stainless steel, the grooves 36 can be formed easily by etching or pressing. Moreover, since the vibration plate 30, positioned facing the plurality of individual electrodes 32, also serves as a common electrode which generates an electric field in the piezoelectric layer 31, it is not necessary to provide separately a common electrode in addition to the vibration plate 30, and the structure of the piezoelectric actuator 3 is simplified.

Further, the vibration plate 30 having the grooves 36 formed therein is joined to an upper surface of the cavity plate 10 so that the pressure chambers 14 are covered (joining step). The joining step is performed by using an adhesive or by diffusion joining. Here, the vibration plate 30 after the grooves 36 have been formed therein in the above-mentioned groove forming step tends to break due to decline in strength, particularly in portions formed with the grooves 36. However, because the vibration plate 30 is joined to the cavity plate 10 on an uppermost layer of the channel unit 2 before forming the piezoelectric layer 31 in the surface of the vibration plate 30, the vibration plate 30 is reinforced by the channel unit 2 (cavity plate 10) and hardly breaks, and handling of the vibration plate 30 in a piezoelectric layer forming step which will be described later becomes easy.

Figure 6B:
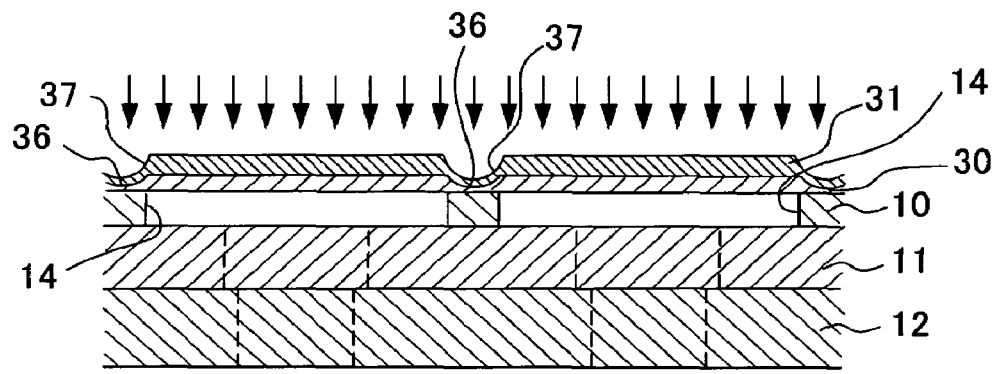

Next, as shown in FIG. 6B, the piezoelectric layer 31 is formed on a surface of the vibration plate 30 on the opposite side of the channel unit 2 (piezoelectric layer forming step). Here, in this piezoelectric layer forming step, the piezoelectric layer 31 is formed by depositing particles of PZT on the surface of the vibration plate 30 by a method such as chemical vapor deposition (CVD) method, aerosol deposition (AD) method. At this time, the area of the vibration plate 30 where the grooves 36 have been formed has a recessed form, on which the grooves 37 having a planer shape similar to the grooves 36 are to be formed.

Figure 7:
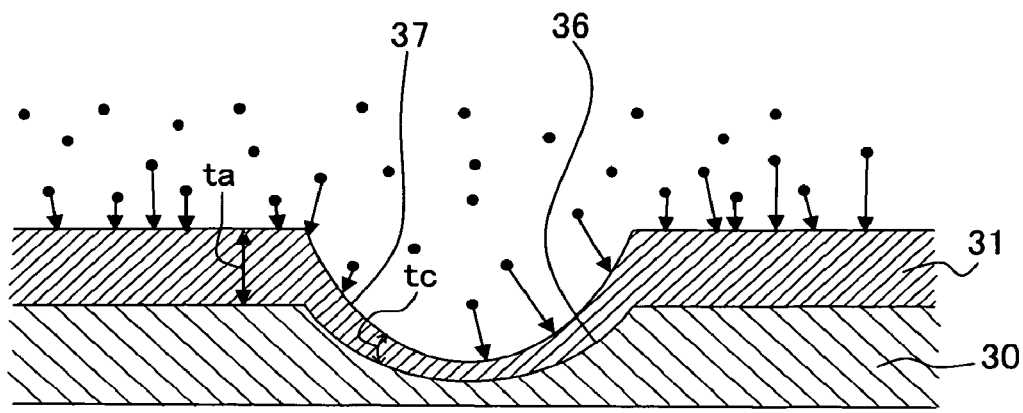
FIG. 7 is a diagram explaining the piezoelectric layer forming step by a chemical vapor deposition (CVD) method.

Here, as an example of a case of forming the piezoelectric layer by using chemical vapor deposition (CVD) method, a case using a metal organic chemical vapor deposition (MOCVD) method of forming a thin film by dissolving a raw material in an organic solvent, and vaporizing the material, and allowing a gas phase reaction to occur on a surface subjected to processing will be described below. Materials such as lead bismuth (dipivaloylmethanato) ($Pb(DPM)_2$), zirconium tetrakis (dipivaloylmethanato) ($Zr(DPM)_4$), and titanium (di-isopropoxy dipivaloylmethanato) ($Ti(iPrO)_2(DPM)_2$) can be used as the raw material (for example, see Japanese Patent Application Laid-open Publication No. 2004-79695). When the vibration plate 30 is heated to about 600° C., the gas phase reaction occurs between the above-described materials on the surface of the vibration plate 30, and the piezoelectric layer 31 of lead zirconate titanate (PZT) is formed on the surface of the vibration plate 30. Here, as shown in FIG. 7, a raw material gas is hardly supplied to a space inside the groove 36 formed in the vibration plate 30, as compared to a surface of the vibration plate 30 in which the groove 36 is not formed. Therefore, since a speed of formation of the piezoelectric layer 31 on the surface of the groove 36 becomes slow, a thickness Tc of the piezoelectric layer 31 in the groove 37 becomes less than a thickness Ta of the piezoelectric layer 31 in other area of the piezoelectric layer 31 where the groove 37 is not formed.

Moreover, in a case of forming the piezoelectric layer 31 by aerosol deposition (AD) method in which ultra fine particles are deposited by colliding the particles onto a surface subjected to processing at high speed, a proportion of rebounded fine particles, which do not contribute to the film forming, in an inner surface of the groove 36 of the vibration plate 30 becomes high. Accordingly, in the inner surface of the groove 36, the particles are not deposited easily as compared to other surface of the vibration plate 30, and the thickness Tc of the piezoelectric layer 31 in the groove 37 becomes less than the thickness Ta of the piezoelectric layer in the area where the groove 37 is not formed.

Thus, by using the chemical vapor deposition (CVD) method or the aerosol deposition (AD) method, the piezoelectric layer 31 on the surface of the groove 36 can be formed to be thinner than the piezoelectric layer 31 in the area where the groove 36 is not formed. Accordingly, the thickness of the piezoelectric layer 31 and the vibration plate 30 in the area in which the grooves 36 and 37 are formed is further reduced, and thus it is possible to reduce the cross talk assuredly. An intermediate layer made of titanium, platinum, and chromium etc. may be formed between the vibration plate 30 and the piezoelectric layer 31 by a method such as sputtering method and vapor deposition method.

Figure 6C:
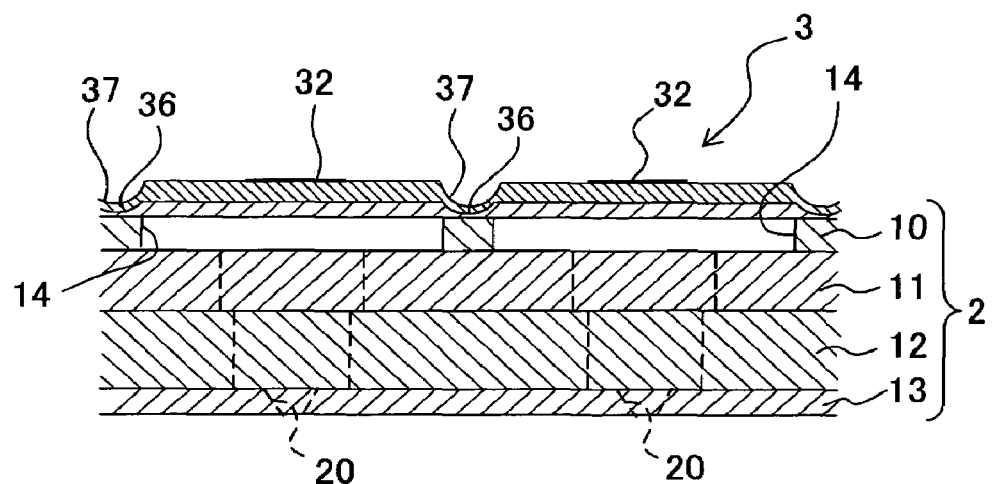

Thus, after the piezoelectric layer 31 is formed on the surface of the vibration plate 30, an annealing treatment for ensuring sufficient piezoelectric characteristics in the piezoelectric layer 31 is carried out, and then, as shown in FIG. 6C, the individual electrodes 32 are formed by using a method such as screen printing, vapor deposition method or sputtering method on the surface of the piezoelectric layer 31 in an area which overlaps in plan view with the pressure chambers 14 (individual electrode forming step). Finally, the nozzle plate 13 made of a synthetic resin is joined to a lower surface of the manifold plate 12 and the manufacture of the ink-jet head 1 is completed.

In the steps of manufacturing the ink-jet head 1 described above, after the vibration plate 30 having the grooves 36 formed therein is joined to the cavity plate 10 which is a part of the channel unit 2, another metallic plate (base plate 11 or the manifold plate 12) which is a part of the channel unit 2 may be joined to the cavity plate 10. Or, when the nozzle plate 13 is a metallic plate made of stainless steel etc., before joining the vibration plate 30 and the cavity plate 10, the channel unit may be formed first by joining the nozzle plate 13 and the other three metallic plates (cavity plate 10, base plate 11, and manifold plate 12). Or, the grooves 36 may be formed in the surface of the vibration plate 30 after joining the channel unit 2 (or the cavity plate 10 in the channel unit 2) and the vibration plate 30. Or, the channel unit 2 (or the cavity plate 10 in the channel unit 2) and the vibration plate 30 may be joined after forming the individual electrodes 32, the piezoelectric layer 31, and the grooves 36 in the vibration plate 30. In this case, it is desirable to perform the joining by using an adhesive rather than by diffusion joining.

According to the method of manufacturing the ink-jet head 1 described above, the following effects can be achieved. In the groove forming step, the grooves 36 are formed in an area on the surface of the vibration plate 30 on the opposite side of the channel unit 2, the grooves 36 extending along the edge of each of the pressure chambers 14, and the area not overlapping in a plan view with the pressure chambers 14, and then in the piezoelectric layer forming step, the piezoelectric layer 31 is formed by depositing the particles of the piezoelectric element on the surface of the vibration plate 30. Therefore, in the area of the vibration plate 30 where the grooves 36 are formed, the grooves 37 are formed also in the area of the piezoelectric layer 31. Since the areas of the vibration plate 30 and the piezoelectric layer 31 formed with the grooves 36 and 37, respectively, are partially thinned (reduced thickness), the deformation of the piezoelectric layer 31 and the vibration plate 30 at a position facing a certain pressure chamber 14 is hardly propagated to the piezoelectric layer 31 and the vibration plate 30 at a position facing other pressure chamber 14, and the cross talk can be reduced. Moreover, the grooves 37 can be formed in the piezoelectric layer 31 only by depositing the particles of a piezoelectric material on the surface of the vibration plate 30 in which the grooves 36 have been formed. Therefore, as compared to a case of forming grooves in the piezoelectric layer 31 by a mechanical process, the manufacturing cost can be reduced and a chip or a crack is hardly developed in the piezoelectric layer 31 in the area where the grooves 37 are formed, and it is possible to improve the yield and reliability of discharge.

In the groove forming process, the groove 36 is formed so as to almost surround one of the pressure chambers 14. Therefore, the deformation of the piezoelectric layer 31 in the area overlapping in plan view with the pressure chamber 14 surrounded by the groove 36 is hardly propagated to an area overlapping with the other pressure chamber 14, thereby reducing the cross talk assuredly. Further, the groove 36 is formed between two adjacent pressure chambers 14 in common for these two adjacent pressure chambers 14 (refer to FIG. 2 and FIG. 3). Therefore, the number of grooves 36 can be reduced and since the thickness of the groove 36 becomes greater, thereby making the forming of the grooves 36 more easily.

In the piezoelectric layer forming step, the piezoelectric layer 31 on the surfaces of the grooves 36 in the vibration plate 30 is formed to be thinner than the piezoelectric layer 31 in the area where no groove 36 are formed. Therefore, the thickness of the piezoelectric layer 31 and the vibration plate 30 in the portion where the grooves 36 are formed is further decreased, thereby reducing the cross talk more assuredly. The piezoelectric layer 31 is not cut and isolated for each of the operating sections, but maintains a continuous form. Therefore, as compared to a case where the piezoelectric layer 31 is cut and isolated for each of the operating sections, the piezoelectric layer 31 is hardly exfoliated from the vibration plate 30 and the mechanical strength and the durability of the piezoelectric layer 31 is improved.

Second Embodiment

Figure 13:
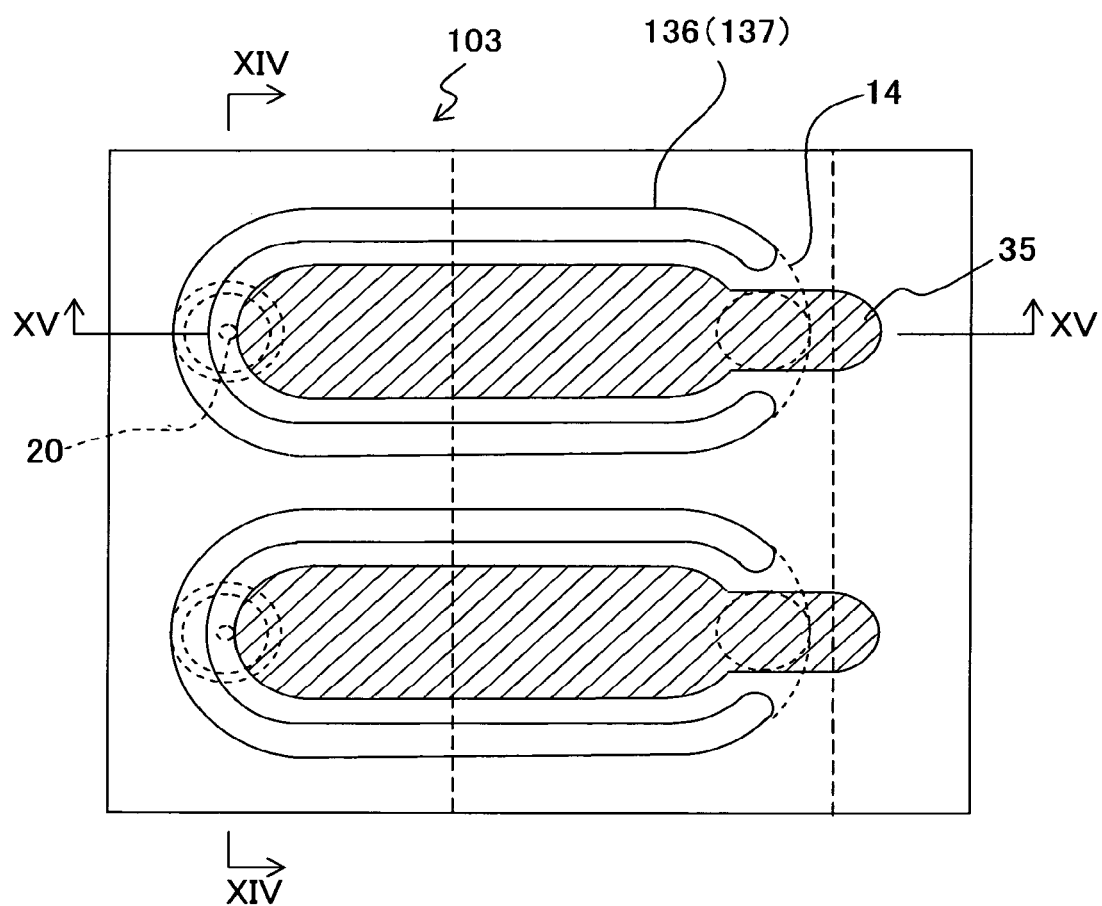
FIG. 13 is a plan view of an actuator of an ink-jet head of a second embodiment.
Figure 14:
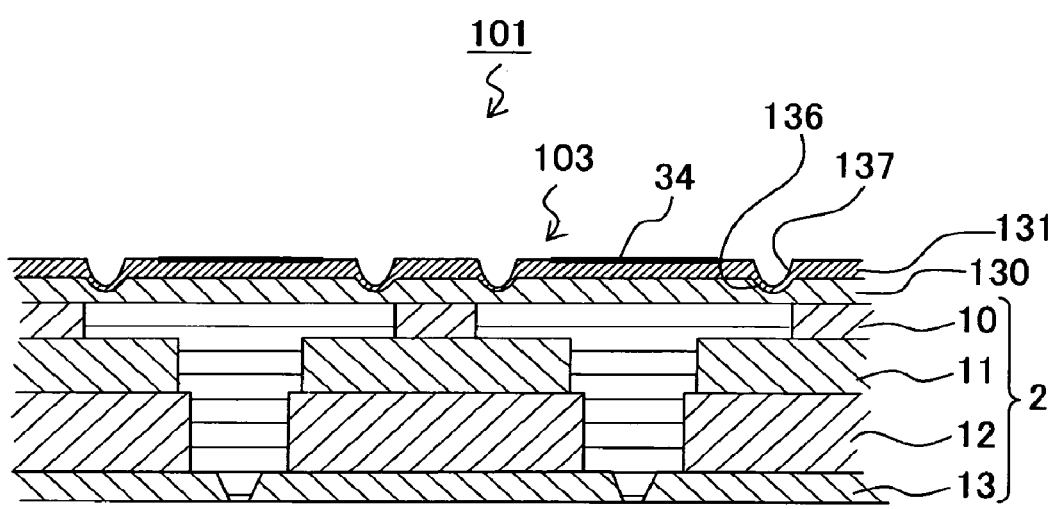
FIG. 14 is a cross-sectional view taken along a line XIV-XIV shown in FIG. 13.
Figure 15:
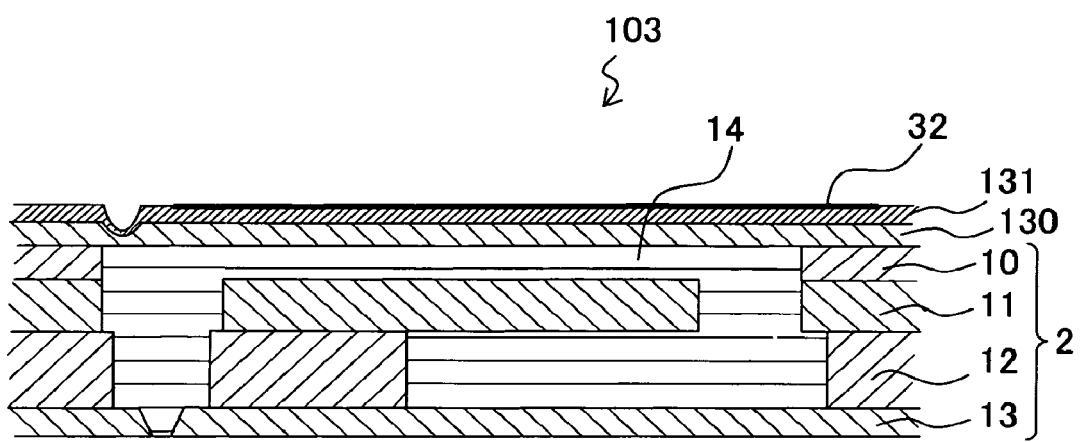
FIG. 15 is a cross-sectional view taken along a line XV-XV shown in FIG. 13.

In the piezoelectric actuator of the ink-jet head in the first embodiment, the grooves are formed in the area of the vibration plate which does not overlap with the pressure chambers, but in a piezoelectric actuator of an ink-jet head in a second embodiment, the grooves are formed in the area of the vibration plate which overlaps with the pressure chambers 14. In a piezoelectric actuator 103 of the ink-jet head 101 in the second embodiment, a groove 136 formed in a vibration plate 130 is provided at a position which overlaps with a circumferential portion of each of the pressure chambers 14 as shown in FIGS. 13 to 15 (plan view in FIG. 13). Therefore, a groove 137 corresponding to each of the grooves 136 in the vibration plate 130 is formed in a piezoelectric layer 131 which is formed on the vibration plate 130. The groove 137 in the piezoelectric layer 131 is also provided at a position which overlaps with one of the pressure chambers 14, and in particular with a circumferential portion of the pressure chamber 14. Thus, even if the groove 136 in the vibration plate 130 is formed in the area overlapping with the pressure chamber 14, it is possible to prevent the cross talk with the adjacent pressure chamber 14. Since a structure of the channel unit 2 and the individual electrodes 32 in the ink-jet head 101 is similar to the structure in the first embodiment, the description of the structure is omitted.

Third Embodiment

Figure 16:
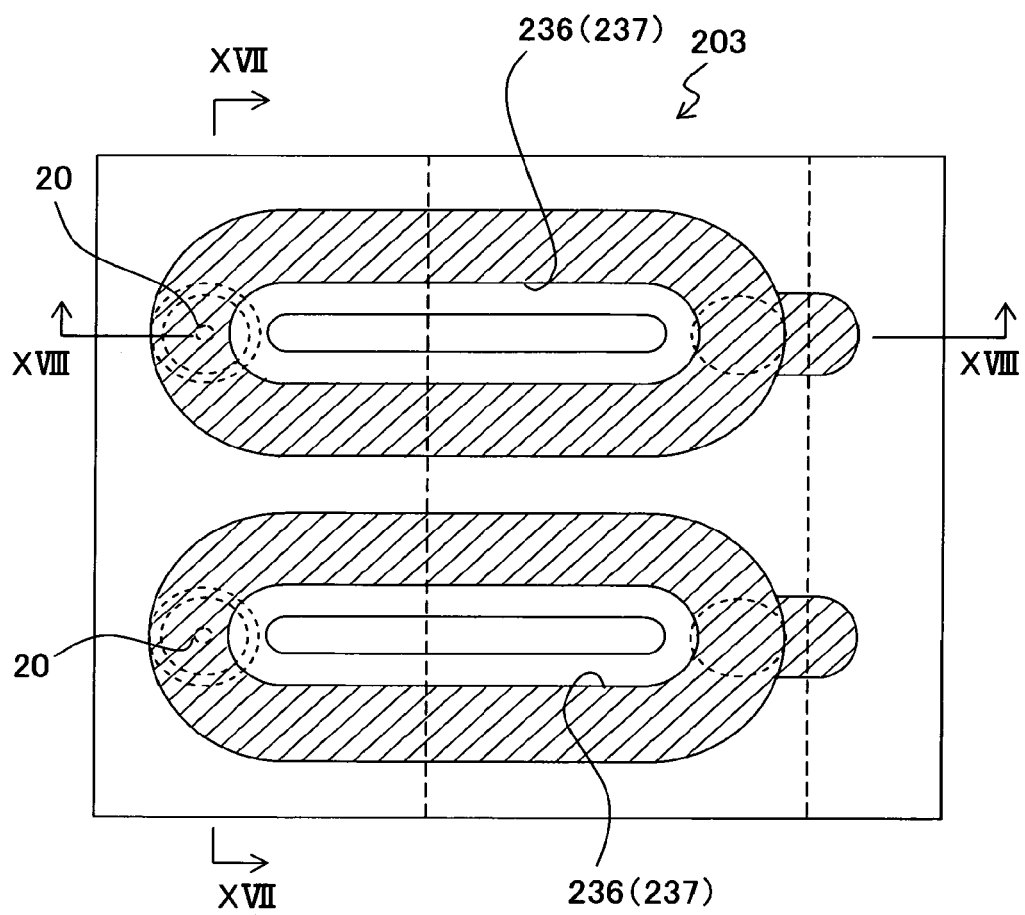
FIG. 16 is a plan view of an actuator of an ink-jet head of a third embodiment.
Figure 17:
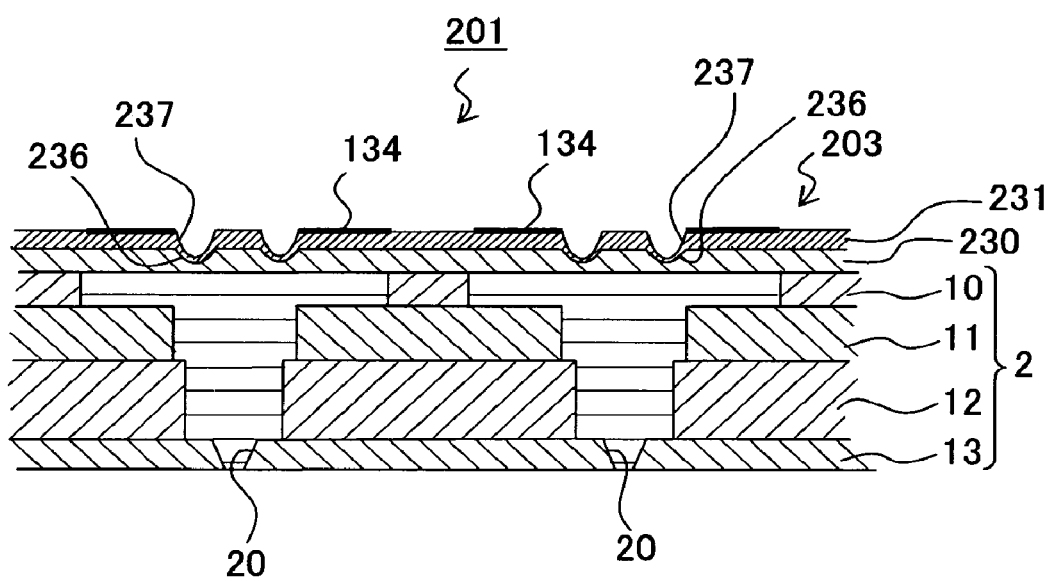
FIG. 17 is a cross-sectional view taken along a line XVII-XVII shown in FIG. 16.
Figure 18:
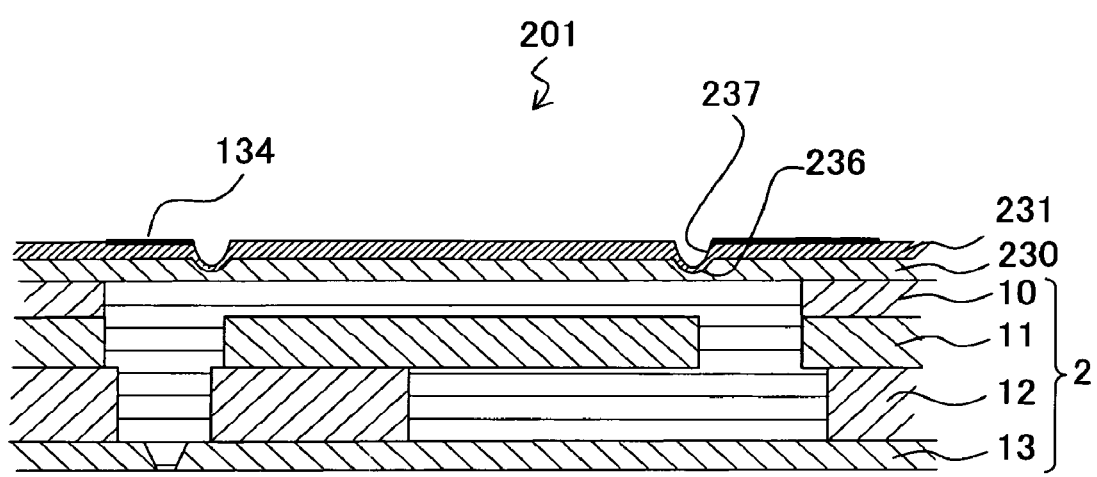
FIG. 18 is a cross-sectional view taken along a line XVIII-XVIII shown in FIG. 16.

In a third embodiment also, an example of an ink-jet head which includes a piezoelectric actuator in which the groove in the vibration plate is formed in an area overlapping with each of the pressure chambers is described. Particularly, in a piezoelectric actuator 203 of this ink-jet head 201, a groove 236 formed in a vibration plate 230 is provided so that the groove 236 surrounds a central portion of each of the pressure chambers 14 as shown in FIGS. 16 to 18 (plan view in FIG. 16). In other words, the grooves are provided so as to divide the area on the vibration plate corresponding to the piezoelectric layer between the central portion and a peripheral portion. Therefore, a groove 237 corresponding to each of the grooves 236 in the vibration plate 230 is formed in a piezoelectric layer 231 which is formed on the vibration plate 230. Individual electrodes 134 are formed to circumvent the grooves 237 on the piezoelectric layer, leaving the grooves 37 uncovered. The grooves 236 and 237 formed in such manner are provided on all the pressure chambers 14 to lower the rigidity in the central portion of the actuator (namely, the central portion of the area on the vibration plate and the corresponding portion of the piezoelectric layer thereto), thereby decreasing the reaction force acting on the joining portion of the vibration plate to the cavity plate and the corresponding portion of the piezoelectric layer to the joining portion when the piezoelectric actuator is driven. Accordingly, it is possible to avoid the cross talk with the respective adjacent pressure chambers 14. Moreover, a structure in which the groove 236 in the vibration plate 230 surrounds the central portion of one of the pressure chambers 14 has been disclosed by the applicant in US Patent Application Publication No. 2003/0107622A1 (corresponding to Japanese Patent Application Laid-open No. 2004-166463) and US Patent Application Publication No. 2005/0069430A1 (corresponding to Japanese Patent Application Laid-open No. 2005-105892), which has an advantage to simplify the driving of the piezoelectric actuator owing to a relationship with a drive voltage obtained, by forming the grooves 236 in such positions. Since a structure of the channel unit 2 etc. in the ink-jet head 201 is similar to the structure in the first embodiment, the description of the structure is omitted. The contents of the US Patent Application Publication Nos. 2003/0107622A1 and 2005/0069430A1 have been incorporated herein by reference.

Fourth Embodiment

Figure 19:
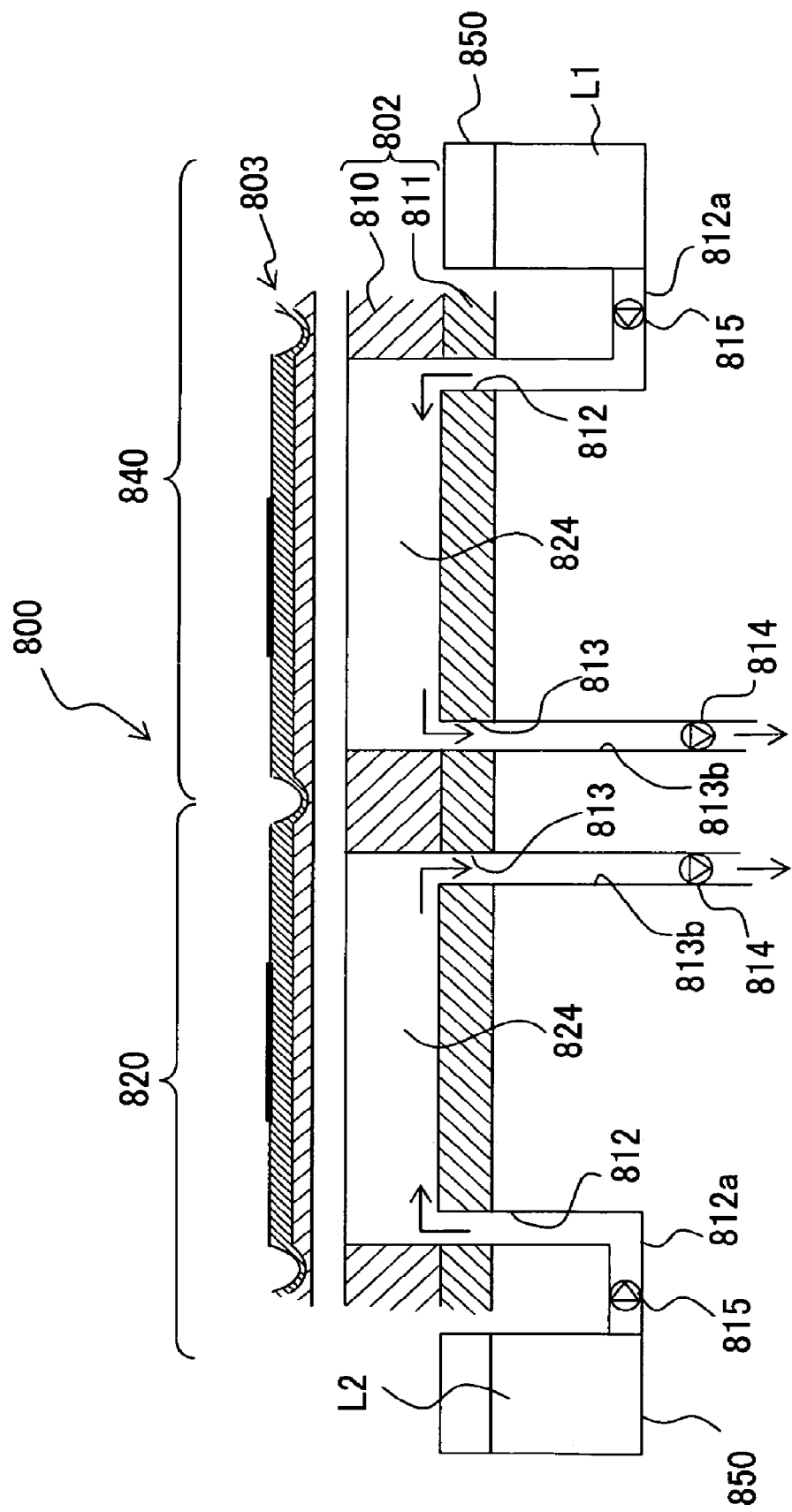
FIG. 19 is a schematic cross-sectional view of a liquid transporting apparatus of a fourth embodiment.

In a fourth embodiment, an example in which the present invention is applied to a liquid transporting apparatus will be described. A liquid transporting apparatus 800 includes a first transporting section 820 and a second transporting section 840 which are capable of transporting different liquids respectively. Each of the transporting sections includes a channel unit 802 which has a pressure chamber 824 formed therein, a piezoelectric actuator 803 which is provided on the channel unit 802 so as to cover the respective pressure chambers 824, and liquid tanks 850 which accommodate liquids L1 and L2, respectively. The channel unit 802 has a cavity plate 810 and a base plate 811 as shown in FIG. 19. The pressure chambers 824 are formed in the cavity plate 810 and the base plate 811 has inlet channels 812 and outlet channels 813 which communicate respectively with the pressure chambers 824. The inlet channel 812 communicates with the liquid tank 850 via a supply-side tube 812a. Moreover, a discharge-side tube 813b is fitted to the outlet channel 813 and the discharge-side tube 813b is connected to a discharge destination which is not shown in the diagram. Non-return valves 814 and 815 are fitted to the supply-side tube 812a and the discharge-side tube 813b respectively. The piezoelectric actuator 803 is similar to the piezoelectric actuator 3 described in the first embodiment and includes a vibration plate, a piezoelectric layer, a common electrode, and individual electrodes. Grooves are formed in the vibration plate and the piezoelectric layer to divide the respective pressure chambers. When the piezoelectric actuator 803 is operated and a volume of the pressure chambers 824 is changed, a pressure difference is developed between the pressure chamber 824 and the liquid tank 850. As a result of this, the liquid L1 (or L2) is supplied from one of the liquid tanks 850 to the associated pressure chamber 824 via the inlet channel 812 and the supply-side tube 812a. On the other hand, the liquid L1 (or L2) in the pressure chambers 824 is discharged via the outlet channel 813 and the outlet-side tube 813b. At this time, by providing the non-return valves 814 and 815, a reverse flow of the liquid to the ink tank 850 is prevented and the liquid is carried assuredly from the liquid tank 850 to the discharge destination.

The liquids L1 and l2 have different colors and different compositions, and only a desired liquid can be discharged (transported) selectively by driving a piezoelectric actuator of a section selected by a user. In this example, an example of a liquid transporting apparatus which includes two transporting sections is described, but three or more of transporting sections may also be provided. Equipments at a site where the liquid transporting apparatus 800 is used may be used as the liquid tanks 850, the non-return valves 814 and 815, the supply-side tubes 812a and the discharge-side tubes 813b. Therefore, the liquid tanks 850, the non-return valves 814 and 815, the supply-side tubes 812a and the discharge-side tubes 813b are not necessarily required for the liquid transporting apparatus 800. Moreover, the liquid tank 850 of the first transporting section 820 and the liquid tank 850 of the second transporting section 840 may be common for these transport sections and the same liquid may be supplied to the pressure chambers of the respective sections.

The liquid transporting apparatus in the present invention enables to transport a liquid selectively via a plurality of liquid discharge outlets with a simple structure without any cross talk developed between the adjacent pressure chambers. This liquid transporting apparatus can be used as a unit module for circulating cooling water in a cooling water channel which is formed in an electric circuit board. Moreover, since the liquid transporting apparatus in the present invention can be used as a micro pump which transports a plurality of liquids, it is possible to supply a plurality of types of medicines in a predetermined quantity to patient's body and with a predetermined time schedule.

Next, modified embodiments in which various modifications are incorporated in the embodiments, particularly the above-described first embodiment, will be described. Same reference numerals are used for components which have a structure identical to a structure in the embodiments described above, and the description of such components is omitted.

First Modified Embodiment

Figure 8:
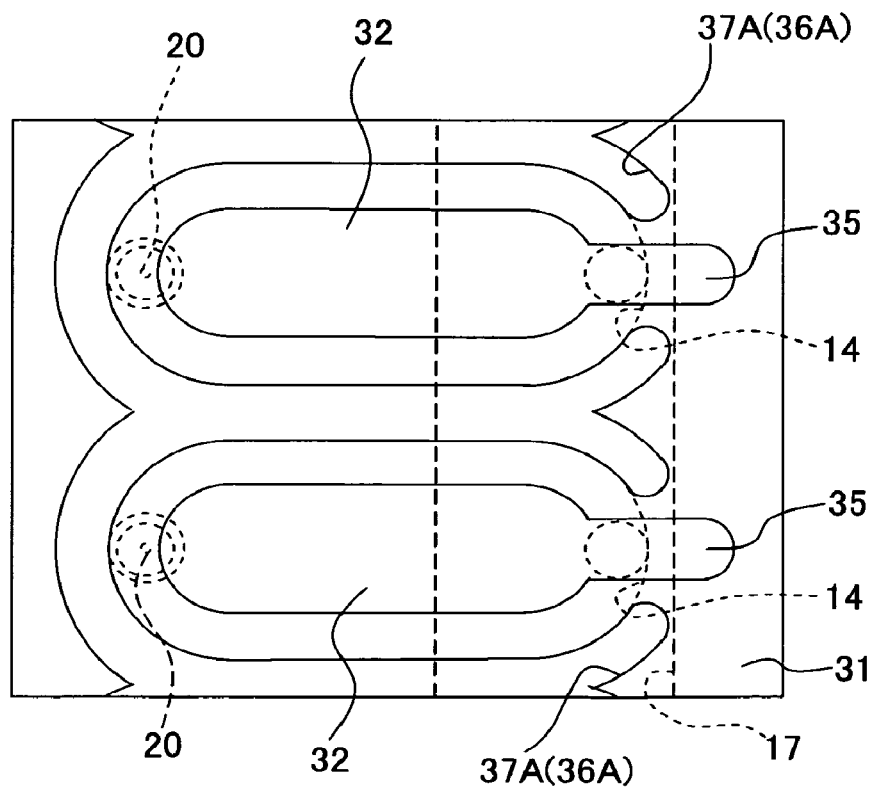
FIG. 8 is an enlarged plan view corresponding to FIG. 3 of a first modified embodiment.

The groove in the vibration plate is not restricted to have a shape as in the embodiments described above. For example, instead of forming a groove 37A for the piezoelectric layer 31 and a groove 36A for the vibration plate 30 in common between two rows of the pressure chambers 14 (see FIG. 2), the grooves 36A and 37A may be formed independently for each row of the pressure chambers 14 as shown in FIG. 8.

Second Modified Example

Figure 9:
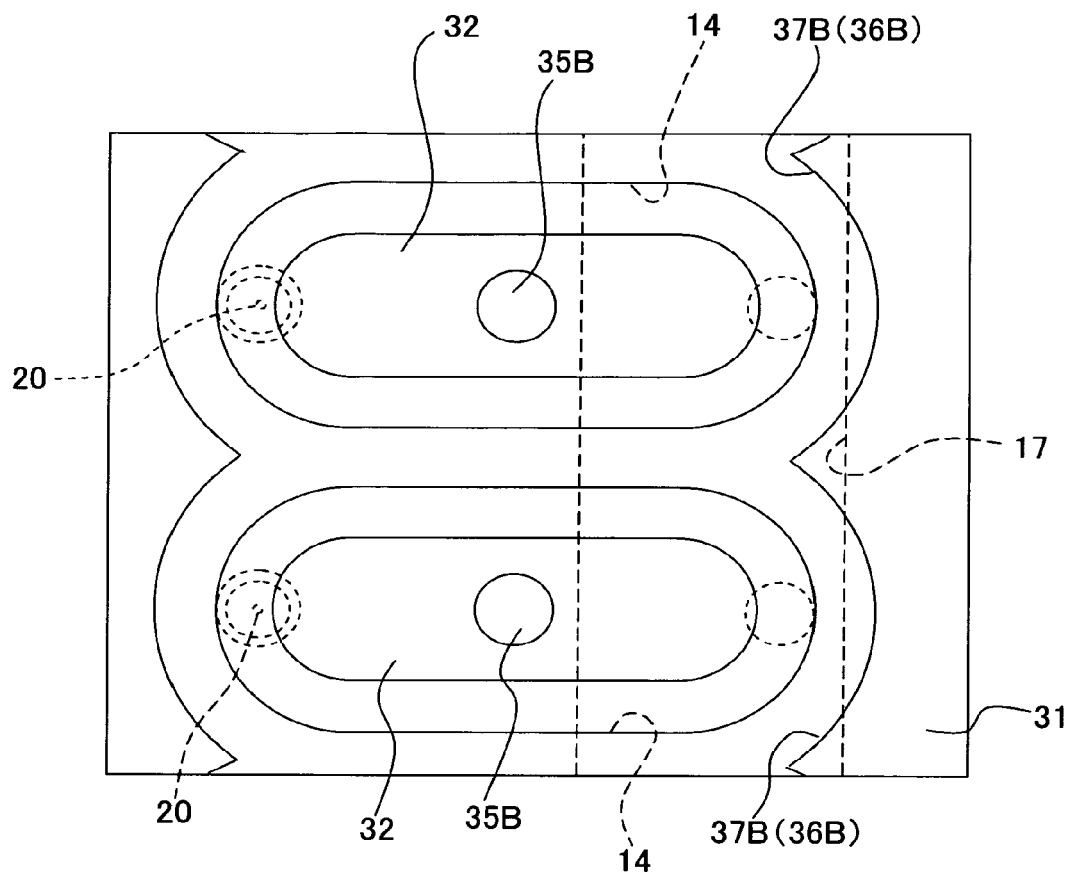
FIG. 9 is an enlarged plan view corresponding to FIG. 3 of a second modified embodiment.

Moreover, in a case where a terminal section 35B, to which a wiring member such as a flexible printed wiring board is connected is formed on the surface of the individual electrode 32, a groove 36B (37B) may be formed to surround the pressure chambers 14 entirely as shown in FIG. 9. In this case, the cross talk can be reduced even more effectively.

Third Modified Example

Figure 10:
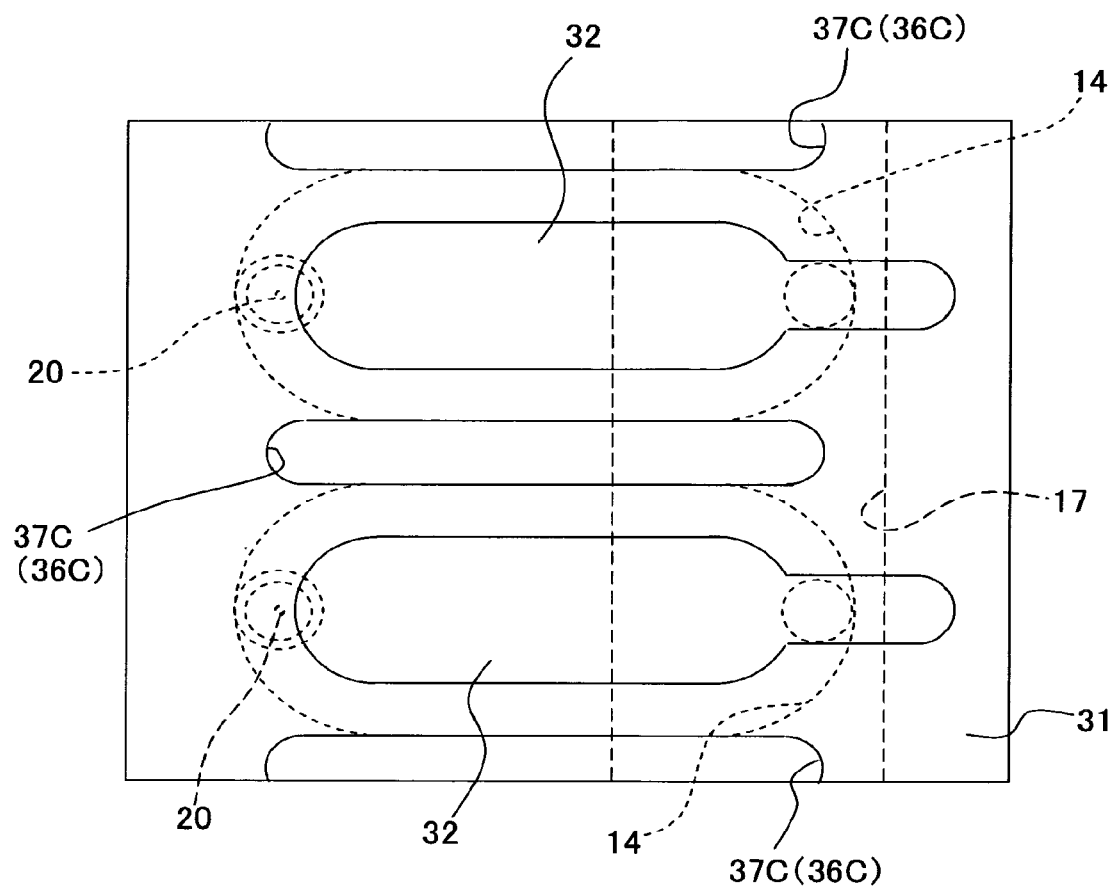
FIG. 10 is an enlarged plan view corresponding to FIG. 3 of a third modified embodiment.

Furthermore, a groove 36C (37C) which extends in both of the left and right sides along the edge of the pressure chamber 14 may be formed only between the nearest pressure chambers 14 (between pressure chambers 14 adjacent to each other in the paper feeding direction (vertical direction in FIG. 10)) as shown in FIG. 10.

Fourth Modified Example

Figure 11:
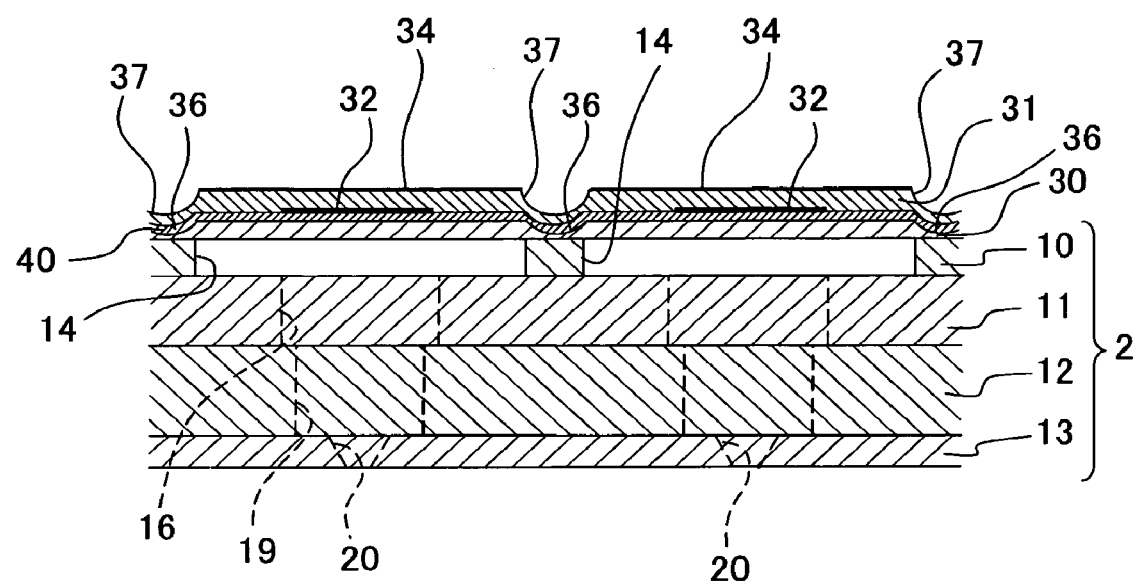
FIG. 11 is an a cross-sectional view corresponding to FIG. 4 of a fourth modified embodiment.

In the piezoelectric actuator 3 in the embodiment described above, the vibration plate 30 which serves also as a common electrode is arranged on the lower side of the piezoelectric layer 31, and the individual electrodes 32 are formed on the upper side of the piezoelectric layer. However, the present invention is also applicable to a case where the arrangement of the individual electrodes and the common electrode is reversed. In this case, after forming the groove 36 in the vibration plate 30 (groove forming step) and joining vibration plate 30 to the surface of the cavity plate 10 (joining step), an insulating film 40 formed of a ceramics material such as alumina and zirconia is formed by a method such as aerosol deposition (AD) method, vapor deposition method, or sputtering method (insulating film forming step), and the plurality of individual electrodes 32 is formed on a surface of the insulating film 40 in an area overlapping in a plan view with the pressure chambers 14 (individual electrode forming step) as shown in FIG. 11. Then, the piezoelectric layer 31 is formed on the surface of the insulating layer 40 by chemical vapor deposition (CVD) method or aerosol deposition (AD) method similarly as in the embodiment (piezoelectric layer forming step), and finally a common electrode 34 is formed on a surface of the piezoelectric layer 31 in an area overlapping in a plan view with the pressure chambers 14 (individual electrodes 32), by a method such as screen printing, vapor deposition method, or sputtering method (common electrode forming step). The joining step may be carried out after the common electrode forming step.

Fifth Modified Embodiment

Figure 12:
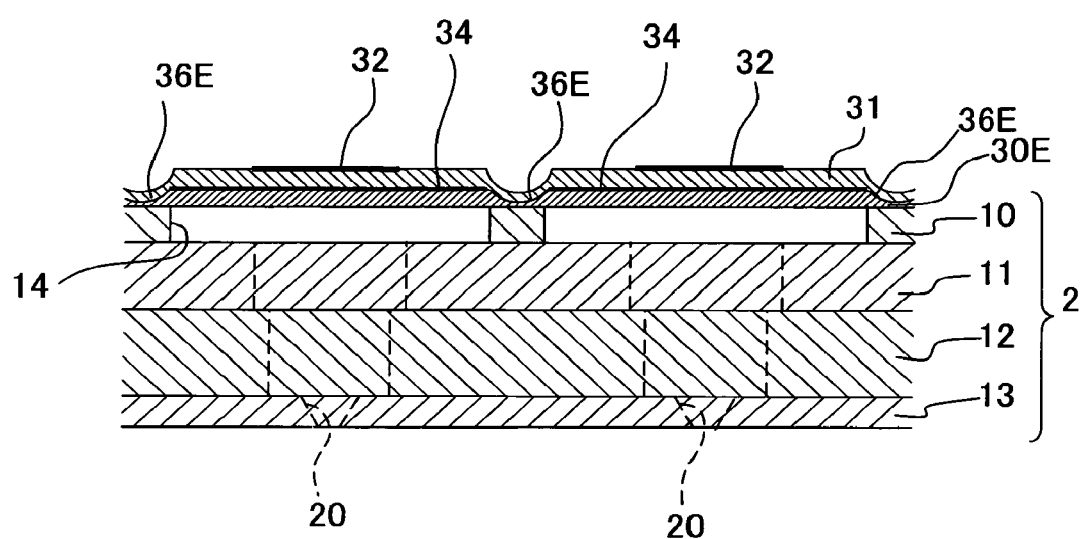
FIG. 12 is a cross-sectional view corresponding to FIG. 4 of fifth modified embodiment.

The vibration plate is not restricted to the one which is made of a metallic material and is electroconductive, and may be a one which is made of a non-electroconductive material such as silicon, a synthetic resin, glass, or ceramics with a surface oxidation treatment performed thereon. In this case, the plurality of individual electrodes 32 can be arranged on the upper side of the piezoelectric layer 31 as in the embodiments described above. However, since the vibration plate in the fifth modified embodiment is not electroconductive, the vibration plate cannot serve as the common electrode. Therefore, a step of separately forming the common electrode on the surface of the vibration plate becomes necessary. In other words, as shown in FIG. 12, after forming grooves 36E in a non-electroconductive vibration plate 30E by etching, pressing, or injection molding and joining the vibration plate 30E to the surface of the cavity plate 10, a plurality of common electrodes 34 may be formed on a surface of the vibration plate 30E in an area overlapping with the pressure chambers 14 by a method such as screen printing, vapor deposition method, or sputtering method. In a case where the plurality of individual electrodes 32 are arranged on the lower side of the piezoelectric layer 31 as in the fourth modified embodiment (refer to FIG. 11) described above, since the manufacturing process is almost similar to that in the fourth modified embodiment, the description of the manufacturing process is omitted.

The first to third embodiments and the modified embodiments described above are examples in which the present invention is applied to an ink-jet head which discharges ink from the nozzle. However, the liquid-jet apparatus to which the present invention is applicable is not restricted to the ink-jet head. The present invention can be applied to liquid transporting apparatuses such as various liquid-jet apparatuses for forming a minute wiring pattern on a substrate by discharging a conductive paste, or for forming a highly defined display by discharging an organic illuminant on a substrate, and further for forming a micro optical device such as an optical guided wave path by discharging an optical resin on a substrate. The piezoelectric actuator according to the present invention can be used as an optical switch or an optical deflector plate for optical communication by providing an optical element such as a mirror on the piezoelectric actuator. Or, the piezoelectric actuator in the present invention can be used as a display unit in which each operating section is a pixel. Further, the liquid transporting apparatus may be used not only for ink but also for transporting various liquids such as blood, water, and solvents.

What is claimed is:

1. A piezoelectric actuator which has a plurality of operating sections, comprising:
    a vibration plate having first grooves formed therein, the first grooves being associated with respective operating sections, respectively;
    a piezoelectric layer which is provided on the vibration plate, and has second grooves formed therein, the second grooves corresponding to the first grooves in the vibration plate, and in which a thickness of the piezoelectric layer in the second grooves is less than a thickness of the piezoelectric layer in an area in which no second groove are formed; and
    individual electrodes which are provided on the operating sections of the piezoelectric layer, respectively, and which supply a drive voltage to the operating sections, respectively.

2. The piezoelectric actuator according to claim 1, wherein each of the grooves is provided for one of the operating sections.

3. The piezoelectric actuator according to claim 1, wherein each of the grooves is provided between adjacent operating sections among the plurality of operating sections.

4. The piezoelectric actuator according to claim 1, wherein the vibration plate is an electrode which is common for the operating sections.

5. The piezoelectric actuator according to claim 1, wherein the thickness of the piezoelectric layer in the second grooves is less than a depth of the first grooves.

6. A liquid transporting apparatus comprising:
   a channel unit including a plurality of pressure chambers formed therein, each of the pressure chambers having a supply port and a discharge port which discharges a liquid; and
   a piezoelectric actuator as defined in claim 1 wherein the vibration plate is provided on the channel unit to cover the pressure chambers.

7. The liquid transporting apparatus according to claim 6, wherein the grooves are provided for each of the pressure chambers.

8. The liquid transporting apparatus according to claim 6, wherein the vibration plate is an electrode which is common for the pressure chambers.

9. The liquid transporting apparatus according to claim 6, wherein the thickness of the piezoelectric layer in the second grooves is less than a depth of the first grooves.

* * * * *